United States Patent
Shiba et al.

(10) Patent No.: US 7,385,686 B2
(45) Date of Patent: Jun. 10, 2008

(54) METHOD AND APPARATUS FOR INSPECTING SEMICONDUCTOR DEVICE

(75) Inventors: Shigemitsu Shiba, Tokyo (JP); Keitaro Takagi, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 227 days.

(21) Appl. No.: 10/873,294

(22) Filed: Jun. 23, 2004

(65) Prior Publication Data
US 2004/0263830 A1  Dec. 30, 2004

(30) Foreign Application Priority Data
Jun. 27, 2003  (JP) .............................. 2003-184654

(51) Int. Cl.
G01N 21/00  (2006.01)
H01L 21/66  (2006.01)
(52) U.S. Cl. ............................. 356/237.1; 356/237.5; 438/16
(58) Field of Classification Search .. 356/237.1–237.6; 324/751–752, 538, 71.3, 158.1; 438/287, 438/689, 14–17; 374/5, 15
See application file for complete search history.

(56) References Cited

U.S. PATENT DOCUMENTS

| | | | |
|---|---|---|---|
| 5,422,498 A | | 6/1995 | Nikawa et al. ............... 257/48 |
| 5,708,371 A | * | 1/1998 | Koyama ...................... 324/752 |
| 5,804,980 A | | 9/1998 | Nikawa ....................... 324/752 |
| 5,952,837 A | | 9/1999 | Koyama ...................... 324/752 |
| 5,971,608 A | * | 10/1999 | Koizumi ........................ 374/5 |
| 6,066,956 A | * | 5/2000 | Nikawa ....................... 324/752 |
| 6,444,895 B1 | | 9/2002 | Nikawa ....................... 136/212 |
| 6,593,156 B2 | * | 7/2003 | Nikawa ......................... 438/17 |
| 6,840,667 B2 | * | 1/2005 | Schlagheck et al. ........... 374/5 |
| 7,015,051 B2 | * | 3/2006 | Shiba ............................ 438/14 |
| 2002/0106820 A1 | | 8/2002 | Nikawa ........................ 438/14 |
| 2003/0056570 A1 | * | 3/2003 | Shin et al. ................. 73/25.05 |
| 2006/0079058 A1 | * | 4/2006 | Shiba .......................... 438/287 |

FOREIGN PATENT DOCUMENTS

JP  60149955 A  *  8/1985
KR  2000-0023498  4/2000

OTHER PUBLICATIONS

Schurig T. et al., "Nondestructive Wafer Inspection Utilizing Squids" Institute of Physics Converence Series, IOP Publishing, Ltd., pp. 149 to 152, Sep. 7, 1997.
Konuma, M. et al., "Insight into Semiconductor Laser" KogaKytosho Ltd., 2nd Edition, Engineering, May 25, 1998 (with English translation of Chapters 4 and 5).

* cited by examiner

*Primary Examiner*—Sang Nguyen
(74) *Attorney, Agent, or Firm*—Fitzpatrick, Cella, Harper & Scinto

(57) ABSTRACT

A laser diode chip is scanned and irradiated with laser light penetrating the interior of crystal of a chip and having a wavelength which produces no electromotive force by optical excitation. When the temperature of a chip 1 increases through irradiation, a thermoelectromotive force is generated in a crystal abnormal part of the chip 1 by a Seebeck effect. This thermoelectromotive force is detected from a change of a voltage or current appearing between the anode and cathode of the chip 1 and displayed at a CRT to thereby detect defects inside the crystal.

6 Claims, 5 Drawing Sheets

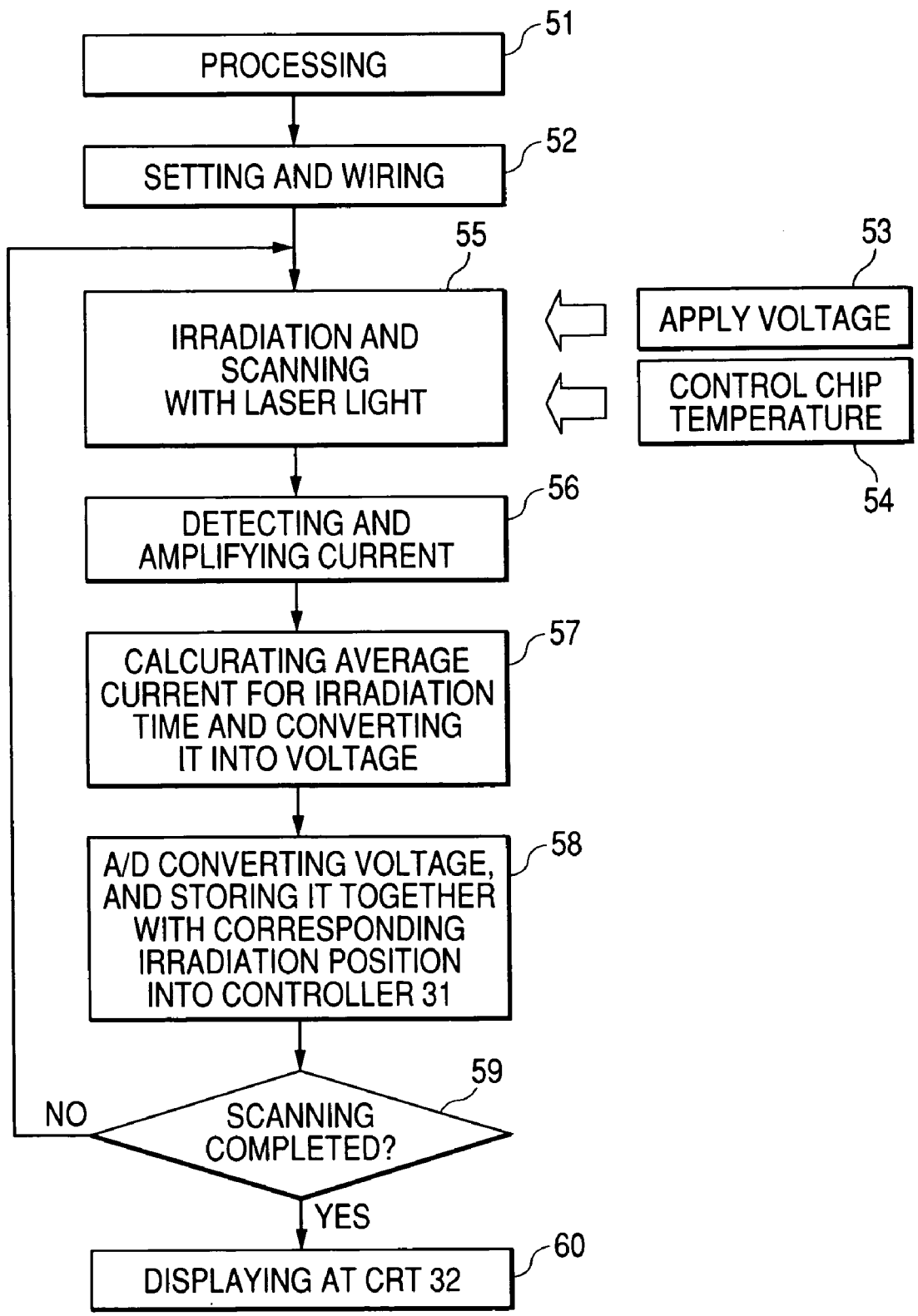

METHOD AND APPARATUS FOR INSPECTING SEMICONDUCTOR DEVICE

BACKGROUND OF THE INVENTION

1. Field of the Invention

The present invention relates to a method and apparatus for observing, analyzing and inspecting crystal defects preferably applicable to analysis and inspection of internal crystal defects or junction fracture due to electrical stress, etc., of a semiconductor device, a compound semiconductor laser diode device in particular.

2. Related Background Art

As shown in FIG. 4, a general compound semiconductor laser diode device is constructed of a laser diode chip 1, a submount 2 on which the laser diode chip 1 is mounted, a stem 3 integral therewith, a photodiode 4 which detects optical output, a sealing glass-windowed cap 5, an anode 19a which applies a voltage to the laser diode chip 1 and a cathode 19b, etc. The laser diode chip 1 generally has a laminated structure of several types of semiconductor. As shown in FIG. 5, the laser diode chip 1 incorporates an oscillator (stripe) 8 for trapping laser light and amplifying laser light by resonance and the oscillator 8 is constructed of part of the laminated semiconductor. Furthermore, one end of the anode 19a, cathode 19b is connected to the laser diode chip 1 to apply a voltage to the laser diode chip 1. Many technologies have been conventionally developed for fault analysis and inspection of this compound semiconductor laser diode (hereinafter referred to as "laser diode").

First, a near field pattern (NFP) observation method is generally well known which two-dimensionally captures a light-emitting state of the end face of the laser diode chip 1 at the laser light emitting position using an infrared camera, etc., observes the light-emitting form and compares it with a conforming product to decide abnormalities ("Insight Into Semiconductor Laser" written and compiled by Minoru Konuma, Mitsuyoshi Shibata, 2nd edition, Engineering).

However, since the NFP observation method observes only the end face which reflects laser beam, it can only detect traces of damage by COD (optical damage) fracture appearing as optical information on the end face. Therefore, it is difficult to check abnormalities such as crystal defects inside the chip.

Furthermore, an analysis, inspection method for observing the light-emitting state of the oscillator 8 called a "stripe observation method" is also known. The method of inspecting using this technique will be explained using FIG. 5. First, in order to make the whole oscillator 8 in the longitudinal direction observable from the top surface of the laser diode chip 1, the top electrode 6 which intercepts light transmission is chemically or mechanically removed. FIG. 5 shows the top electrode 6 whose part has been removed. When the entire surface is removed, a new electrode is formed at a position which will not obstruct observation of the oscillator 8 later. Then, in this condition, a voltage is applied from a voltage supply 122 between the anode 9a and cathode 9b of the laser diode chip 1. The upper electrode 9a and a lower electrode 7 beneath the laser diode chip 1 are connected to the anode 9a and cathode 9b respectively, and therefore a current is generated in the laser diode chip 1 and the oscillator 8 inside starts to emit light. This oscillator 8 which emits striped light is observed using an infrared camera 101, etc., and this state is compared with a conforming product to observe abnormalities.

The stripe observation method further includes a CL observation method which chemically or mechanically removes part from the oscillator 8 inside the chip to the outer surface of the chip until the thickness is reduced to an extent that electron beams pass and observes crystal defects, etc., through cathode luminescence (CL) of the oscillator 8. This principle will be explained. When electron beams are directly irradiated onto the oscillator 8 of the laser diode chip 1, electrons are inelastic-scattered by a sample and lose energy. Part of this energy excites a valence band and produces pairs of electron and hole. Electrons and holes scatter in the sample, recombine at certain positions and light is emitted at this time. This light emission reflects a band structure in the defect area, thereby produces a difference in light emission intensity and spectral shape from other normal areas and finding out this difference makes it possible to identify the defect.

According to the stripe observation method, when there are abnormalities such as crystal defects and fractures in an oscillator for checking the light emitting image, these areas can be observed as non-light-emitting parts in many cases, making it possible to identify the abnormal areas. However, since it is light emission without directionality, the boundary between the non-light-emitting areas and light-emitting areas, is ambiguous and in the case of micro abnormal areas in particular, these areas may not be detected due to blurring, etc., of light from the peripheral area. Furthermore, infrared light emitted from the oscillator is observed after passing through other parts of the chip, but visible light can hardly be transmitted, and therefore it is not possible to obtain physical information of the oscillator layer from the outside. For this reason, even if there are non-light-emitting areas (abnormal areas), it is only possible to identify those areas, whereas it is not possible to decide what physical condition those parts are in as the laser diode chip.

Since electron beams are used in the CL observation method, observation needs to be performed in vacuum, which leads to a large equipment cost. Furthermore, while the detection accuracy of crystal defects is excellent, it is necessary to reduce the thickness up to the oscillator to a thickness of approximately several microns so that electron beams can be irradiated onto the oscillator, which requires high precision machining and time during preprocessing of a sample. Moreover, as in the case of visible light, it is only possible to obtain information on the form and condition of the surface (approximately 1 micron in depth) of the device as in the case of visible light and it is not possible to obtain information on the chip interior.

(Reference: "Insight Into Semiconductor Laser" written and compiled by Minoru Konuma, Mitsuyoshi Shibata, 2nd edition, Kogakutosho Ltd. May 25, 1998, p111)

As the methods applicable to fault analysis and inspection of a semiconductor integrated circuit chip, OBIC (Optical Beam Induced Current) method and OBIRCH (Optical Beam Induced Resistance Change) method are known.

The OBIC method is an analysis and inspection method using an optically excited current generated by creation of pairs of electron and hole caused by transition between a valence band and conductive band due to light irradiation onto a Si semiconductor device and uses light having a wavelength with larger energy than the energy gap of the target device. For example, in the case of Si semiconductor, using He—Ne laser light having a wavelength of 633 nm, an OBIC current which is an optically excited current is generated efficiently to detect defective areas.

The OBIRCH method scans and irradiates internal mutual wiring in a semiconductor integrated circuit with laser light as visible light and heats it, detects a change in resistance caused by a temperature rise through irradiation and a change of the current flowing through the wiring and detects defects in the wiring (U.S. Pat. Nos. 5,422,498 and 5,804, 980).

However, the OBIC method is an inspection method for observing an optically excited current and irradiates light having a wavelength with greater energy than the band gap energy of Si semiconductor. The laser beam used is, for example, 633 nm He—Ne laser, etc., and the problem is that there is a limit to the wavelength of light that can be used.

The OBIRCH method cannot detect crystal defects in the area without wiring such as inside the laser diode chip.

SUMMARY OF THE INVENTION

The present invention relates to a method and apparatus for observing, analyzing and inspecting crystal defects preferably applicable to analysis and inspection of internal crystal defects or junction fracture due to electrical stress, etc., of a semiconductor device, a compound semiconductor laser diode device in particular.

The present invention relates to an inspection method or inspection apparatus including the steps of scanning and irradiating a semiconductor device chip such as compound semiconductor laser with quantum beams penetrating the crystal interior of the chip and having a wavelength which produces no electromotive force due to excitation, for detecting a thermoelectromotive force generated in crystal abnormal areas of a chip through irradiation from a change in a voltage or current appearing between the anode and cathode of the chip.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is an overall flow chart of a method of inspecting the semiconductor device according to the embodiment of the present invention;

DESCRIPTION OF THE PREFERRED EMBODIMENTS

Preferred embodiments of the present invention will now be described in detail in accordance with the accompanying drawings.

Embodiment 1

Figure 1:
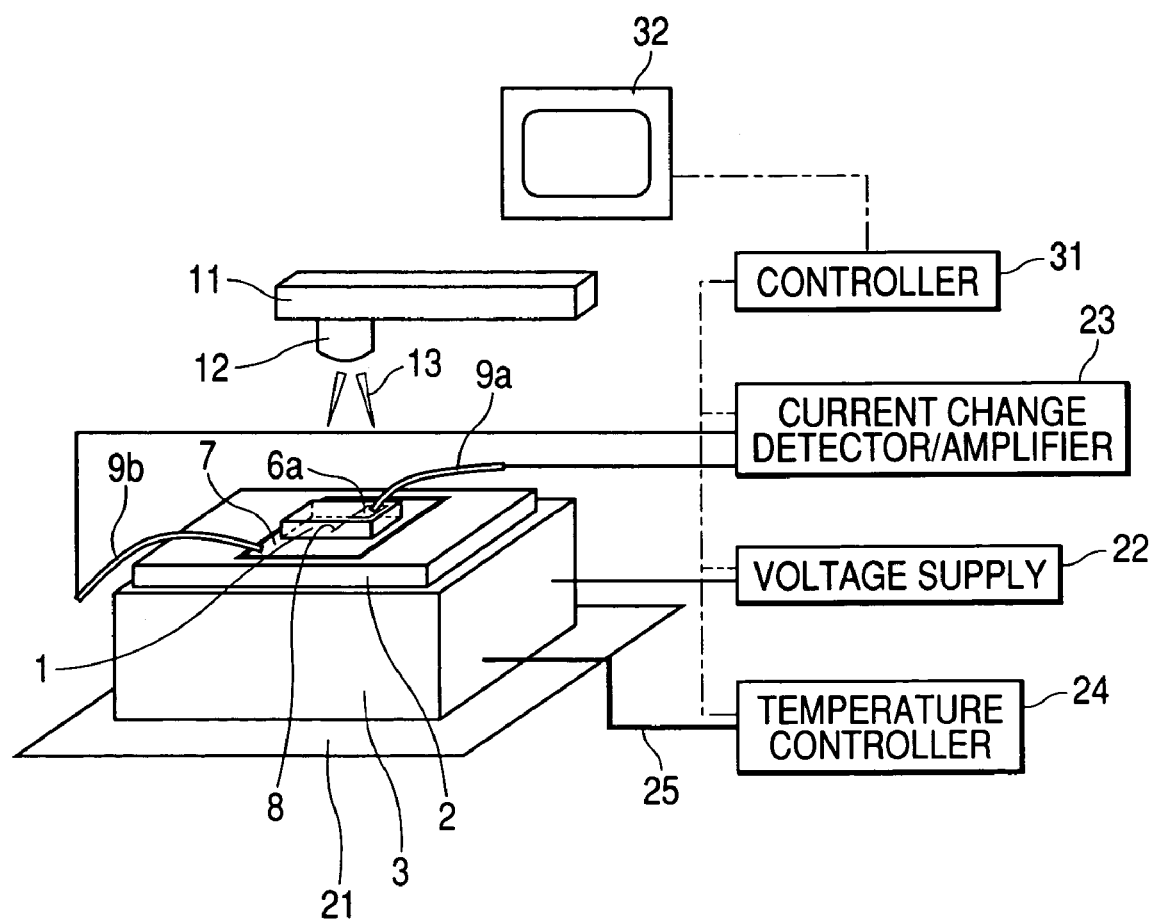
FIG. 1 is an overall block diagram of an analysis apparatus of a semiconductor device according to an embodiment of the present invention.

FIG. 1 is an overall configuration conceptual diagram of an internal defect analysis apparatus of a semiconductor device according to an embodiment of the present invention.

A sample holder 21 is a holder on which a semiconductor device which is a sample is mounted. A compound semiconductor laser diode chip 1, a submount 2 and a stem 3 are mounted and fixed as one body on the sample holder 21.

An upper electrode 6a and a lower electrode are provided on the top surface and under surface of the laser diode chip 1 respectively and these electrodes are connected to an anode 9a and a cathode 9b respectively. The other ends of the anode 9a and cathode 9b are connected to a current change detector/amplifier 23. The current change detector/amplifier 23 detects and amplifies a change in a current generated inside the laser diode chip 1 the moment laser light 13 is irradiated onto various points.

A voltage supply 22 for supplying a voltage to the laser diode chip 1 is connected to the sample holder 21. Furthermore, a temperature controller 24 for controlling temperature of the laser diode chip 1 is connected to the sample holder 21 through a thermal medium pipe 25.

A laser light generator/scanner 11 for generating laser light 13 and scanning the laser diode chip 1 is provided on the sample holder 21. Furthermore, a microscope 12 for narrowing luminous flux of the laser light 13 is provided between the laser light generator/scanner 11 and sample holder 21. The laser light generator/scanner 11 and microscope 12 are set so as to observe mainly the peripheral section of the oscillator 8 of the laser diode chip 1 in the vertical direction from the top surface.

The controller 31 is connected to the laser light generator/scanner 11, current change detector/amplifier 23 and temperature controller 24, receives information on the scanning position of the laser light 13, current change of the laser diode chip 1, temperature and voltage, etc., applied to the laser diode chip 1, processes and stores the information. The controller 31 is also connected to a CRT 32 which displays the observation results which are converted to information on the position and brightness and sends the processed and stored result to the CRT 32 as required.

Then, the method of inspecting the laser diode chip 1 according to this embodiment will be explained. FIG. 2 schematically displays an overall flow thereof.

Figure 3A:
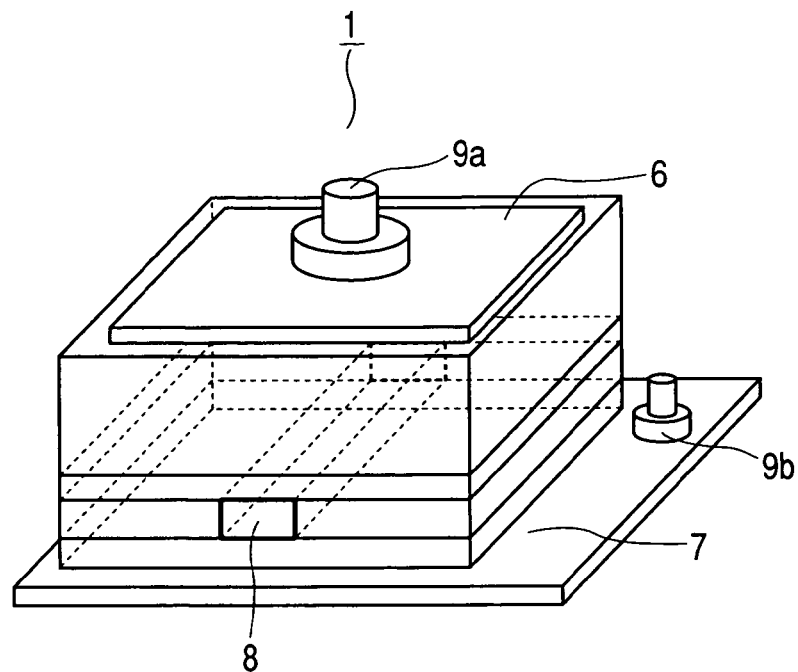
FIGS. 3A and 3B illustrate a preprocessing method of a laser diode device according to the inspection method shown in FIG. 2.
Figure 3B:
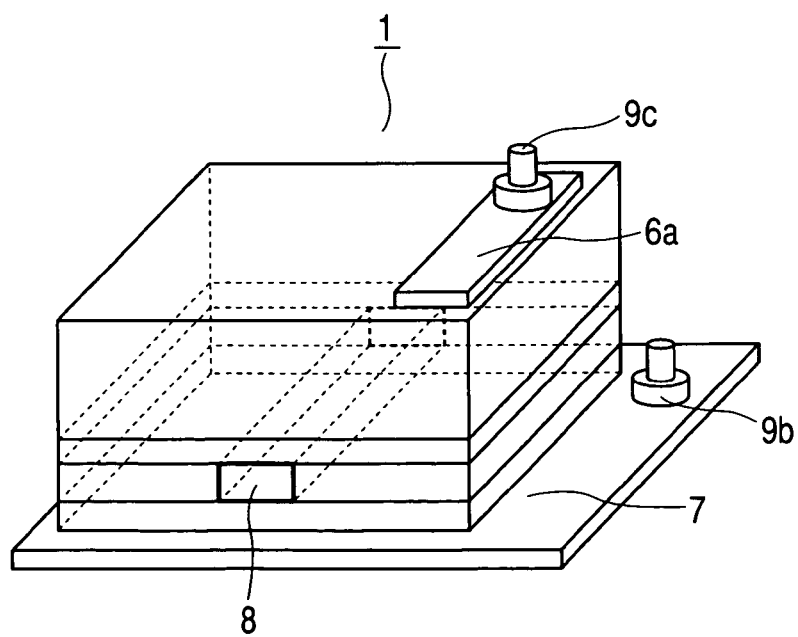
Figure 4:
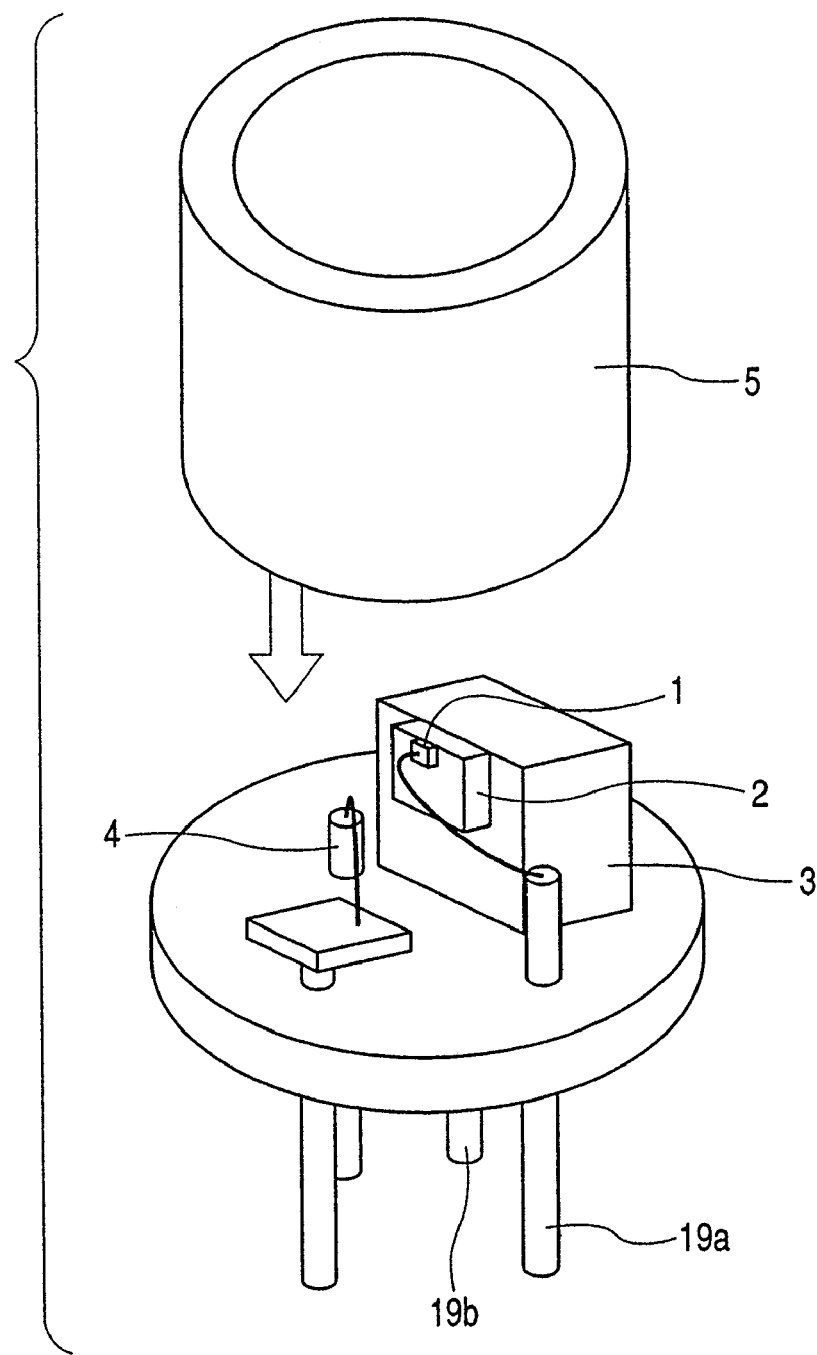
FIG. 4 is an external view of a compound semiconductor laser diode device.
Figure 5:
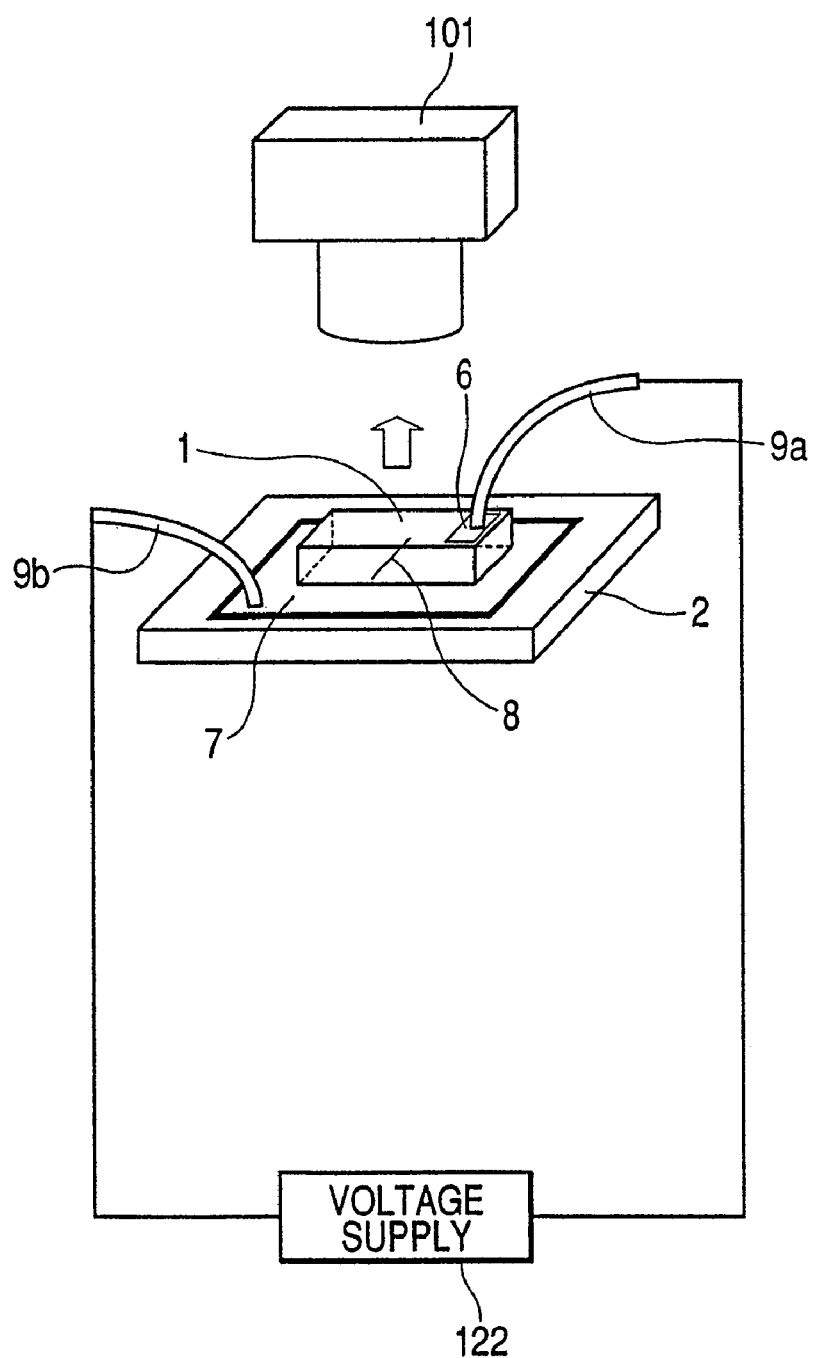
FIG. 5 illustrates a conventional inspection method of a compound semiconductor laser diode.

First, processing of the laser diode chip 1 will be carried out (step 51). The specific content of the processing will be explained using FIGS. 3A and 3B below. FIG. 3A is an external view of the laser diode chip 1 before the processing and FIG. 3B is an external view of the laser diode chip 1 after the processing. As shown in FIG. 3A, the upper electrode 6 is provided on the surface of the laser diode chip 1 and the lower electrode 7 is provided on the back surface thereof. These electrodes are provided with functions of applying the voltages received from the anode 9a and cathode 9b to the laser diode chip 1. In the processing, the upper electrode 6 is removed by chemical or physical means first. The reason for the removal is that when the laser light 13 is irradiated onto the laser diode chip 1 from the top surface, the presence of the upper electrode 6 prevents effective irradiation onto the oscillator 8. The upper electrode 6 is used as an electrode to detect a current change of the laser diode chip 1 during an inspection of the laser diode chip 1 and send it to the current change detector/amplifier 23, and therefore it is efficient to remove only the upper electrode 6 close to the oscillator 8 which is a main inspection area. FIG. 3B shows the removed upper electrode as the upper electrode 6a. When the entire upper electrode 6 is removed, a new upper electrode 6a needs to be provided. In this case, the upper electrode 6a is provided at a position which will not interfere with irradiation of the laser light 13 onto the oscillator 8 for the above described reason. Furthermore, when the anode 9a is removed together with the upper electrode 6, a new anode 9c is provided at a position which will not interfere with irradiation.

The case where the upper electrode 6 is irradiated with the laser light 13 has been explained so far, but it is also possible to irradiate the lower electrode 7 with the laser light 13. In this case, the above described processing can be applied to the lower electrode 7.

Then, the sample on which the laser diode chip 1 is mounted is placed on the sample holder 21 (step 52). The laser diode chip 1 is positioned in such a way that the laser light 13 from the outside can be irradiated perpendicular to the longitudinal direction of the oscillator 8 inside the chip.

Furthermore, the upper electrode 6a and lower electrode 7 are connected to the current change detector/amplifier 23 through the anode 9a and the cathode 9b (step 52).

Since applying a forward bias or backward bias is effective to increase the detection sensitivity of the abnormal part, a voltage is applied from the voltage supply 22 to the laser diode chip 1. (step 53). Furthermore, for the purpose of increasing the detection sensitivity of the abnormal part, the temperature of the laser diode chip 1 is controlled by the temperature controller 24 in the like manner (step 54). Since the thermoelectromotive force current depends on the temperature of the sample, the temperature controller 24 controls the temperature of the laser diode chip 1 in such a way that the efficiency of generation of the thermoelectromotive force current reaches a maximum making it possible to carry out an inspection with higher reliability.

Then, the laser diode chip 1 is scanned and irradiated with the laser light 13 (step 55). To suppress the generation of the OBIC current which is an optically excited current to a minimum, the laser light 13 irradiated has lower energy (a longer wavelength) than the band gap of the laser diode chip 1 to be observed and at the same time has energy (a short wavelength) enough to penetrate the laser diode chip 1.

When there is any abnormal part such as defect in the laser diode chip 1, a thermoelectromotive force current is generated due to a Seebeck effect caused by the irradiation of the laser light 13. The Seebeck effect refers to a phenomenon in which when there is a temperature difference between two contact points of a closed circuit made up of two types of metal, etc., an electromotive force is produced to flow a current. In an area where physical properties and composition partially differ due to abnormalities such as crystal defects, thermal conduction and thermoelectric power differ from those in the periphery, and therefore its resistance increases or decreases compared to the periphery and a difference is produced in the thermoelectromotive force. As a result, the current varies compared to the periphery which is a normal part. The current produced is sent from the upper electrode 6a and lower electrode 7 through the anode 9c and cathode 9b to the current change detector/amplifier 23 and amplified as appropriate (step 56). The amplified micro current is averaged during a residence time of the laser light 13 at various scanning points, converted to a voltage (step 57), further A/D-converted and recorded in a memory inside the controller 31 corresponding to the scanning position (step 58). After confirming that the scanning of the preset scanning range is completed (step 59), the irradiation of the laser light 13 is completed.

Note that instead of measuring the current between the anode 9c and cathode 9b, it is also possible to directly measure the voltage between the anode 9c and cathode 9b.

The controller 31 further converts a voltage value corresponding to each scanning point in the memory to a brightness signal and sends it together with the scanning point data to the CRT 32. The CRT 32 two-dimensionally displays the data on the screen (step 60). This allows a contrast change corresponding to a change of the current depending on the location of irradiation (presence/absence of abnormal part) by scanning of laser light to be observed. Besides brightness, it is also possible to use pseudo-colors (e.g., 256-gradation display).

An example of application where a defect of a crystalline structure of a compound semiconductor laser diode chip is detected has been explained so far, but the present invention is not limited to this embodiment and is also applicable to other semiconductor devices. The present invention is also effective when an inspection is carried out using quantum beams such as electron beams or ion beams in addition to laser light.

As described above, the present invention can detect crystal defects resident in a semiconductor device such as compound semiconductor laser diode chip and crystal fracture caused by electrical stress accurately. The present invention can also detect crystal defects resident in a chip of a device which comes to have a fault in the market after being produced as a semiconductor device, and thereby search for the cause and take effective measures.

What is claimed is:

1. A method of inspecting a crystal defect in a semiconductor laser diode device chip comprising:
    a step of scanning and irradiating a junction of the semiconductor laser diode device chip with quantum beams having energy smaller than an energy band gap of a semiconductor forming the semiconductor laser diode penetrating the interior of crystal of said chip and having a wavelength which produces no electromotive force by excitation; and
    a step of detecting and displaying a thermoelectromotive force generated by said irradiation in a crystal defect of said junction based on a change of voltage or current appearing between an anode and a cathode of said chip, wherein while a change of said voltage or current is detected, a backward bias is applied between said anode and said cathode of said chip.

2. The inspection method according to claim 1, wherein said display is carried out by displaying the relationship between the irradiation position of said quantum beam and change of said voltage or current corresponding to said irradiation position on a screen.

3. The inspection method according to claim 1, wherein while a change of said voltage or current is detected, the temperature of said chip is controlled to a temperature at which said current generated is substantially maximized.

4. An apparatus for inspecting a crystal defect in a semiconductor laser diode device chip comprising:
    irradiating means for scanning and irradiating a junction of the semiconductor laser diode device chip with quantum beams having energy smaller than an energy band gap of a semiconductor forming the semiconductor laser diode penetrating the interior of crystal of said chip and having a wavelength which produces no electromotive force by excitation; and
    displaying means for detecting and displaying a thermoelectromotive force generated by said irradiation in a crystal defect of said junction based on a change of voltage or current appearing between an anode and a cathode of said chip; and means for applying, while a change of said voltage or current is detected, a backward bias between said anode and said cathode of said chip.

5. The inspection apparatus according to claim 4, wherein said displaying means is means for displaying the relationship between the irradiation position of said quantum beam and change of said voltage or current corresponding to said irradiation position on a screen.

6. The inspection apparatus according to claim 4, further comprising means for controlling, while a change of said voltage or current is detected, the temperature of said chip to a temperature at which said current generated is substantially maximized.

* * * * *